(12) United States Patent
Rantakari

(10) Patent No.: US 7,050,724 B1
(45) Date of Patent: May 23, 2006

(54) OPTICAL RECEIVER

(75) Inventor: Erkki Rantakari, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/566,438

(22) Filed: May 8, 2000

Related U.S. Application Data

(63) Continuation of application No. PCT/FI98/00891, filed on Nov. 13, 1998.

(30) Foreign Application Priority Data

Nov. 13, 1997 (FI) .................................... 974224

(51) Int. Cl.
*H04B 10/06* (2006.01)

(52) U.S. Cl. ..................................... 398/209

(58) Field of Classification Search ................ 359/189; 250/214 A; 330/308; 398/209
See application file for complete search history.

(56) References Cited

U.S. PATENT DOCUMENTS

| | | | | |
|---|---|---|---|---|
| 4,415,803 | A |   | 11/1983 | Muoi ...................... 250/214 A |
| 4,620,321 | A | * | 10/1986 | Chown ................... 250/214 A |
| 4,805,236 | A | * | 2/1989 | Urala .......................... 398/202 |
| 5,012,202 | A |   | 4/1991 | Taylor ........................ 330/284 |
| 5,111,324 | A | * | 5/1992 | Jahromi ...................... 359/189 |
| 5,146,079 | A | * | 9/1992 | Lisco ................... 250/214 AG |
| 5,416,530 | A | * | 5/1995 | Luly .......................... 348/607 |
| 5,565,672 | A | * | 10/1996 | Siegel et al. ............. 250/214 A |
| 5,646,573 | A | * | 7/1997 | Bayruns et al. ......... 250/214 A |

FOREIGN PATENT DOCUMENTS

| | | |
|---|---|---|
| DE | 3212733 | 9/1984 |
| DE | 3543677 | 6/1987 |
| DE | 3633984 | 4/1988 |
| DE | 42 12 934 | 10/1993 |
| DE | 4212934 | 10/1993 |
| EP | 0 402 044 | 12/1990 |
| EP | 0 433 646 | 6/1991 |
| EP | 0433646 | 6/1991 |
| EP | 0 718 991 | 6/1996 |
| GB | 2096852 | 10/1982 |
| GB | 2 247 798 | 3/1992 |
| GB | 2247798 A | * 3/1992 |

OTHER PUBLICATIONS

Merriam Webster's Collegiate Dictionary, Tenth Edition, 1997, p. 581, item "impedance".*

May 31, 1999, International Search Report for PCT/FI98/00891.

* cited by examiner

*Primary Examiner*—M. R. Sedighian
*Assistant Examiner*—Shi K. Li
(74) *Attorney, Agent, or Firm*—Squire, Sanders & Dempsey L.L.P.

(57) ABSTRACT

The invention relates to an optical receiver comprising a transimpedance amplifier having an input and an output, a photo detector (PD) for converting the optical power arriving at the receiver, an adjustable impedance element (D1) operationally connected to the input of the transimpedance amplifier, and control means (CU) for controlling the current passinh through the impedance element by adjusting the impedance of the impedance means. In order for the receiver to have a high dynamic range, the adjustable impedance element is a PIN diode and the control means comprise (a) separating means (LPU) for separating the direct voltage component from the output voltage of the transimpedance amplifier, and (b) means (VCU) for adjusting the voltage over the PIN diode directly on the basis of the separated direct voltage component.

12 Claims, 1 Drawing Sheet

OPTICAL RECEIVER

This application is a continuation of international application serial number PCT/FI98/00891, filed 13 Nov. 1998.

FIELD OF THE INVENTION

The invention relates generally to an optical receiver. More specifically, the invention relates to a control loop to be used in an optical receiver, wherewith the dynamic range of the input amplifier is widened.

BACKGROUND OF THE INVENTION

An optical transmission system comprises an optical transmitter converting an electrical signal to be transmitted into optical form, (b) an optical fibre serving as a conductor for the optical signal, and (c) an optical receiver detecting the transmitted optical signal and converting it into electrical form.

A typical optical receiver comprises at its input stage a photo detector and a transimpedance amplifier whose input is connected to the photo detector. The photo detector converts the optical signal it has received into electric current that is supplied to the transimpedance amplifier. The latter generates at its output a voltage proportional to the incoming current, and thus a voltage proportional to the current of the photo detector is obtained from the output of the amplifier. The photo detector is usually either an avalanche photo diode (APD) or an optical PIN diode. Avalanche photo diodes are typically used at shorter wavelengths and optical PIN diodes at longer wavelengths, at which avalanche photo diodes generate a considerable amount of noise. Transimpedance amplifiers are generally used for example for the reason that they allow comparatively good sensitivity properties to be achieved with a relatively simple construction.

Notwithstanding transimpedance amplifiers, one problem in optical receiver solutions lies in their poor dynamics: good sensitivity often entails a poor power tolerance and a good power tolerance again poor sensitivity. Poor dynamics for their part impair the operational flexibility of the receiver; for example when beginning to use a shorter fibre, an extra attenuator must be added between the transmitter and the receiver.

Since the power level of the optical signal arriving at the receiver can in practice vary a great deal (depending on how long fibre is used), automatic gain control (AGC) is typically used in connection with the transimpedance amplifier to keep the amplifier's output voltage essentially at a constant value, when the incoming signal is higher than a predetermined threshold value.

When good sensitivity is aimed at, the stray capacitances on the input terminal of the amplifier are significant; even a small capacitance will impair the sensitivity of the receiver. Hence, it is essential that the parasitics on the input of the amplifier can be minimized.

An attempt has been made to widen the dynamic range of the receiver by using an adjustable resistive element in front of the transimpedance amplifier. The resistance of the element is adjusted in response to the strength of the signal arriving at the amplifier in such a way that at higher levels the resistance is diminished, as a result of which the current coupled to the input of the amplifier will diminish (part of the current passes through the resistive element) and the amplifier is not saturated. This basic solution is known in several different variations, which will be briefly described in the following.

A control circuit is presented in U.S. Pat. No. 5,012,202 and in EP Patent Publication 433 646-B1, wherein a field-effect transistor (FET) is used as the resistive element. To prevent the drain capacitance of the field-effect transistor from reducing the amplifier's sensitivity, it must be compensated for with a feedback over the field-effect transistor. Such a feedback, however, makes the circuit even more complicated. In addition, the feedback makes it more difficult to design the receiver.

An alternative that is better than the field-effect transistor is to use a diode with a naturally low capacitance as the adjustable resistive element. There are several different solutions based on a diode.

GB Patent Application 2 247 798-A presents a diode-based solution, wherein based on a voltage formed over a resistor (r, FIG. 1) a switching transistor (TR1, FIG. 1) is used to control a voltage over a diode (D, FIG. 1) and thus to control the dynamic resistance of the diode. To prevent the control circuit from interfering with the DC operating point of the transimpedance amplifier, a capacitor (C2, FIG. 1) must be used to separate it from the amplifier. However, the use of a capacitor causes an additional time constant in the feedback loop, which complicates the design. In addition, the capacitors and the above-mentioned resistor make the circuit more complex, whereby more space than before is also required on the circuit board. All additional components also cause parasitics at high frequencies, which reduces the sensitivity of the receiver.

U.S. Pat. No. 4,415,803 also describes a diode-based solution using such a peak-hold circuit in the control which monitors the peak value of the transimpedance amplifier output. Based on this peak value, the voltage over the diode is controlled so that a part of the amplifier's input current will pass through the diode. A drawback of this solution is that it is difficult to bring about an exact peak-hold circuit at high transmission rates. It is difficult to achieve a great precision in peak value measurements and, besides, expensive special components must be used.

A solution is known from EP Patent Application 402 044-B1, wherein the detector current passes through a resistor (R1, FIGS. 4*a* and 4*b*) and causes a voltage over the diode (D0, FIGS. 4*a* and 4*b*). When this voltage is sufficiently high, the diode begins to conduct, whereby it functions as an attenuator. One drawback of this solution is that the resistor causes noise, which again reduces the sensitivity of the receiver.

SUMMARY OF THE INVENTION

It is an object of the invention to eliminate the drawbacks described above and to provide a solution wherewith the dynamic range of the receiver can be widened in such a way that the circuit solution will remain as simple as possible and furthermore in such a way that impairment in receiver sensitivity is minimal.

This object is achieved with the solution defined in the independent claims.

The idea of the invention is to use a (non-optical) PIN diode as an adjustable resistive element coupled to the input of the transimpedance amplifier, to separate the direct voltage component from the voltage on the output of the transimpedance amplifier, and to adjust the resistance of the PIN diode (the voltage over the PIN diode) on the basis of said direct voltage component. Such an adjustment will change the transimpedance amplifier into a mere voltage amplifier (the feedback used in the transimpedance amplifier is eliminated), as will be described hereinafter.

Since the PIN diode is in reverse when the adjustment is not operative and the adjustment requires no additional components on the input side of the transimpedance amplifier, no high stray capacitances are generated on the input side of the amplifier. Thus, by this means adding a control loop will impair the sensitivity of the receiver as little as possible.

An additional advantage of the solution in accordance with the invention is that conventional, inexpensive components can be used in the circuitry.

BRIEF DESCRIPTION OF THE DRAWINGS

In the following, the invention and its preferred embodiments will be described in closer detail by way of example with reference to FIGS. 1–4 in the accompanying drawing, in which.

DETAILED DESCRIPTION OF THE INVENTION

Figure 1:
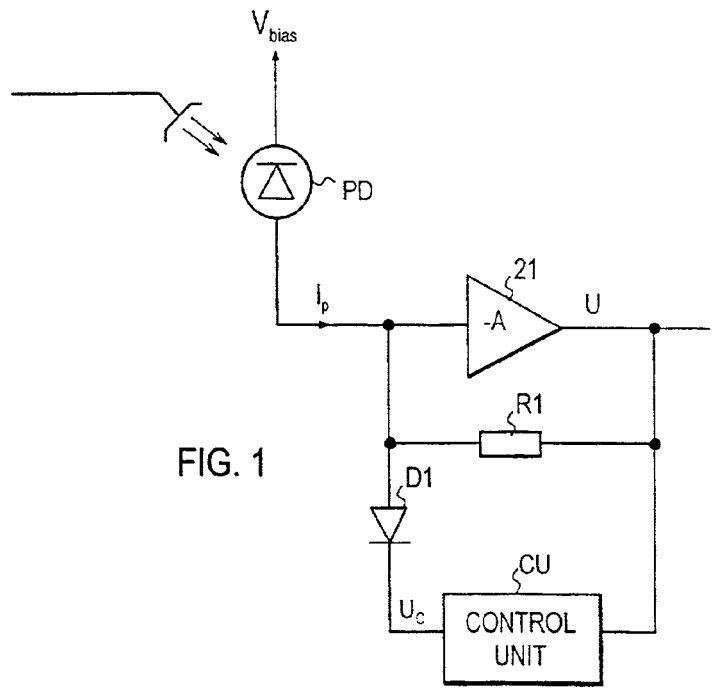
FIG. 1 illustrates a solution in accordance with the invention on a general level.

As is known, a conventional non-optical PIN diode operates at low frequencies as a conventional diode (as a rectifier) but after a certain threshold frequency as a normal resistor. The dynamic resistance $R_d$ of a PIN diode can, as is known, be represented by formula (1):

$$R_d = K/I_{DC}^X \quad (1)$$

where $I_{DC}$ is the direct current passing through the diode and K and X are constants dependent on the properties of the diode and are indicated by the manufacturer of the diode.

In practice, a balanced line code (such as CMI or 5B6B) is used in optical transmission systems, and thus the received optical signal produces on the detector a current whose direct current component is half of the peak value $I_{peak}$, i.e. $I_{DC} = 0.5 \times I_{peak}$. When this current passes through the PIN diode, formula (2) is obtained for the peak value $U_{peak}$ of the voltage over the PIN diode:

$$U_{peak} = R_d \times I_{peak} = K/I_{DC}^X \times I_{peak} = 2 \times K \times I_{DC}^{1-X} \quad (2)$$

However, with PIN diodes the constant X will typically have a value close to one, and thus formula (2) can be approximated into a very simple form (3):

$$U_{peak} \approx 2 \times K \quad (3).$$

Hence, the alternating current component of the voltage (AC voltage) over the PIN diode is independent of the incoming optical power (when the control loop is operative, i.e. when a current passes through the PIN diode). The principle of the invention is based on this finding.

Thus, since the amplitude of the AC voltage is determined by the properties of the PIN diode and not the incoming optical power, a natural control algorithm for the optical receiver is a control algorithm that stabilizes the DC operating point of the amplifier and does not attempt to influence the AC component. (The algorithm keeps the direct voltage values substantially constant irrespective of what the magnitude of the direct voltage component of the incoming optical power is.)

Such a control loop is shown in FIG. 1. As is known, a transimpedance amplifier comprises an inverting (phase shift 180°) voltage amplifier and a feedback resistor coupled over it from the output to the input. In this case, the inverting voltage amplifier is denoted with reference 21 and the feedback resistor with reference R1. The incoming optical signal is converted into a current $I_p$ in a photo detector PD whose anode is coupled to the input of the amplifier and whose cathode is connected to a biasing voltage $V_{bias}$. A control unit CU monitors the DC level of the output voltage of the transimpedance amplifier and adjusts on the basis thereof the direct voltage $U_C$ on the cathode of the PIN diode D1. The photo detector may be of any known type.

Figures 2, 4:
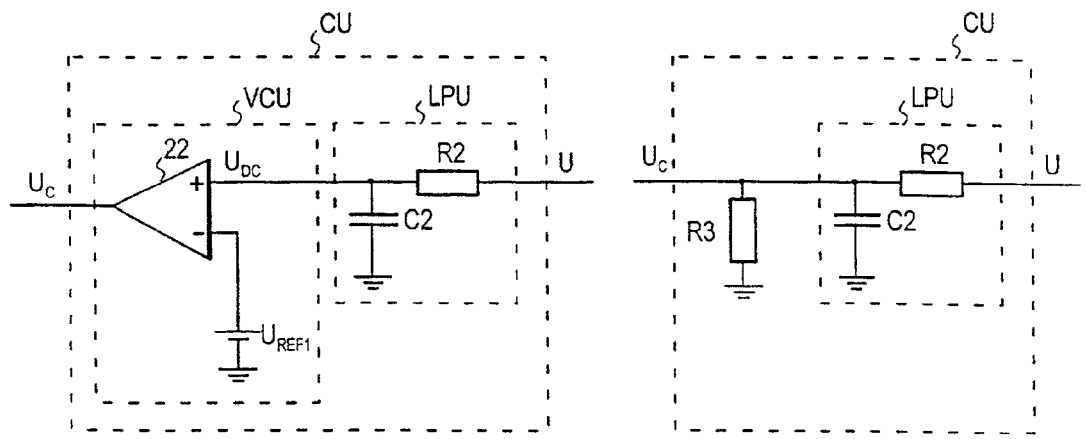
FIG. 2 illustrates the control unit shown in FIG. 1 as a functional block diagram.
FIG. 4 shows an alternative embodiment of the control unit.

FIG. 2 illustrates the configuration of the control unit. The control unit firstly comprises a low-pass unit LPU separating the direct voltage component $U_{DC}$ from the output voltage U of the amplifier 21. In the figure, this low-pass unit is represented by a low-pass filter constituted by resistor R2 and capacitor C2, but said operation can naturally be realized with many different circuit solutions. The low-pass unit is followed by the actual control unit VCU that controls the direct voltage on the cathode of the diode. This part comprises a differential amplifier 22.

Hence, a direct voltage component $U_{DC}$ of the output voltage of the amplifier is obtained at the output of the low-pass unit LPU. This voltage component is coupled to the non-inverted input of the differential amplifier 22. A reference voltage $U_{REF1}$ is coupled to the inverted input of the differential amplifier, on the basis of which the control circuit maintains the DC operating point of the amplifier as desired. The control unit thus pays no attention to AC quantities, as these are determined in accordance with formula (3).

Figure 3:
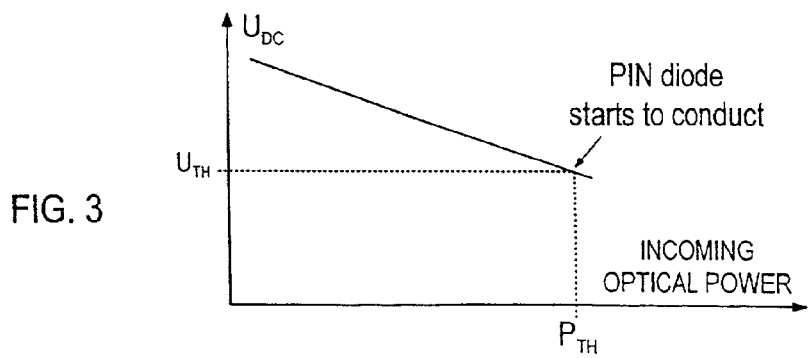
FIG. 3 illustrates the switching on of the control loop in relation to the optical power arriving at the receiver and in relation to the direct voltage component in the output voltage of the transimpedance amplifier.

In the following, the control will be described with reference to FIG. 3, in which the horizontal axis illustrates the incoming optical power and the vertical axis illustrates the direct voltage component $U_{DC}$ of the output voltage of the amplifier. When the incoming optical power is small, the operating point of the transimpedance amplifier is correct. In such a situation, the control unit CU maintains the voltage $U_C$ at the cathode of the diode high, in which case the diode is in reverse. The voltage $U_{DC}$ diminishes when the optical input power increases, as the voltage over the feedback resistor R1 increases as the input power increases. When the DC level of the output voltage of the amplifier has diminished to a given threshold ($U_{TH}$), the PIN diode D1 becomes conductive. At this stage the amplifier, control unit and PIN diode form a closed DC control circuit.

When the PIN diode becomes conductive, its resistance is clearly smaller than the feedback resistance R1, and thus the latter can be disregarded in the circuitry. (Such a situation in practice arises without any special arrangements, as the feedback resistor in practice has a capacity in excess of 100 kiloohms, whereas the resistance of the PIN diode is of the order 1 kiloohm.) Hence, the amplifier 21 serves as a normal voltage amplifier amplifying the voltage over the PIN diode. The control in accordance with the invention thus changes the transimpedance amplifier into a direct voltage amplifier when the input power increases to a sufficient degree.

As was stated at the beginning, when the solution of the invention is used the resistive element (PIN diode) at the input of the amplifier can be adjusted in such a way that no unnecessary parasitics that would impair the sensitivity of the receiver are caused on the input side of the amplifier.

This is due to the fact that at low input power levels a reverse biased PIN diode only appears at the input of the amplifier. Moreover, the solution is simple as it does not require any peak-hold circuits or compensation circuitry for parasitics. At its simplest, the control unit can be implemented in accordance with FIG. 4 with a mere voltage divider by incorporating a voltage dividing resistor (R3) of a suitable size at the output of the low-pass unit. Since this alternative does not use a differential amplifier, the threshold at which the PIN diode starts conducting is, however, not as exact and clear as in the first embodiment of the control unit described above.

Even though the invention has been described in the foregoing with reference to examples in accordance with the accompanying drawings, it is obvious that the invention is not limited thereto, but it can be modified within the scope of the inventive idea set forth in the appended claims. The above is a simplified description of the solution in accordance with the invention. In practice, the circuit solutions realizing an equivalent functionality may vary in many ways. In principle, it is possible to influence the voltage over the PIN diode by influencing (additionally or only) the anode of the diode, even though such an arrangement will generate parasitics at the input of the amplifier.

The invention claimed is:

1. A method for controlling an optical receiver, the method comprising the steps of:
   providing an optical receiver including a transimpedance amplifier providing the output of the optical receiver; a photo detector for converting optical power arriving at the receiver into electric current, output of the photo detector being operationally connected to the input of the transimpedance amplifier; and a control loop consisting of the transimpedance amplifier, a PIN diode having a first terminal operationally connected to the input of the transimpedance amplifier, and means for controlling current passing through the PIN diode by adjusting an impedance of the PIN diode; the PIN diode and the means for controlling the current passing through the PIN diode being connected in series between the input and the output of the transimpedance amplifier;
   controlling current passing through the PIN diode by adjusting an impedance of the PIN diode wherein the PIN diode is used as the adjustable impedance element, and a direct voltage component is separated from a voltage on the output of the transimpedance amplifier; and
   adjusting a voltage over the PIN diode on a basis of a direct voltage component of the voltage on the output of the transimpedance amplifier by means for controlling and adjusting voltage connected in series with the PIN diode between the input of the transimpedance amplifier and the output of the transimpedance amplifiers,
   whereby properties of the PIN diode cause the transimpedance amplifier to serve as a direct voltage amplifier and stabilize the direct current operation point of the transimpedance amplifier when the optical power arriving at the photo detector is above a given threshold.

2. The method according to claim 1, wherein a voltage over the PIN diode is adjusted by adjusting a direct voltage on a cathode of the PIN diode.

3. An optical receiver comprising:
   a transimpedance amplifier having an input and an output, the output providing the output of the optical receiver;
   a photo detector for converting optical power arriving at the receiver into electric current, an output of the photo detector being operationally connected to the input of the transimpedance amplifier; and
   a control loop consisting of
   the transimpedance amplifier;
   a PIN diode having a first terminal and a second terminal, the first terminal being operationally connected to the input of the transimpedance amplifier; and
   means for controlling current passing through the PIN diode by adjusting an impedance of the PIN diode, the means for controlling current being connected in series with the PIN diode between the input of the transimpedance amplifier and the output of the transimpedance amplifier, and the means for controlling current comprising means for separating a direct voltage component from an output voltage of the transimpedance amplifier; and
   means for controlling and adjusting a voltage over the PIN diode on a basis of a separated direct voltage component,
   whereby properties of the PIN diode cause the transimpedance amplifier to serve as a direct voltage amplifier and stabilize the direct current operation point of the transimpedance amplifier when the optical power arriving at the photo detector is above a given threshold.

4. The optical receiver according to claim 3, wherein the means for controlling and adjusting voltage comprises a differential amplifier having an input coupled to a direct voltage component and another input coupled to a reference voltage and having an output connected to the second terminal of the PIN diode.

5. The optical receiver according to claim 4, wherein the means for separating comprises a passive low-pass filter.

6. The optical receiver according to claim 3, wherein the means for separating comprises a passive low-pass filter.

7. The optical receiver according to claim 3, wherein the means for controlling and adjusting voltage comprises a voltage dividing resistor between the means for separating and the second terminal of the PIN diode.

8. The optical receiver according to claim 7, wherein the means for separating comprises a passive low-pass filter.

9. An optical receiver according to claim 3, wherein the means for adjusting and controlling voltage comprise an amplifier, the amplifier adjusting the voltage over the PIN diode directly.

10. A method for controlling an optical receiver, the method comprising the steps of:
    providing an optical receiver including a transimpedance amplifier providing the output of the optical receiver, a photo detector for converting optical power arriving at the receiver into electric current, output of the photo detector being operationally connected to the input of the transimpedance amplifier, and a control loop consisting of the transimpedance amplifier, a PIN diode having a first terminal operationally connected to the input of the transimpedance amplifier, and means for controlling current passing through the PIN diode by adjusting an impedance of the PIN diode; the PIN diode and the means for controlling the current passing through the PIN diode being connected in series between the input and the output of the transimpedance amplifier;
    controlling current passing through the PIN diode by adjusting an impedance of the PIN diode wherein the PIN diode is used as the adjustable impedance element, and a direct voltage component is separated from a voltage on the output of the transimpedance amplifier; and adjusting a voltage over the PIN diode on a basis of a direct voltage component of the voltage on the output of the transimpedance amplifier by means for controlling and adjusting voltage connected in series with the PIN diode between the input of the transimpedance amplifier and the output of the transimpedance amplifier, wherein the means for controlling and adjusting voltage comprises an amplifier having an input coupled to the direct voltage components, whereby properties of the PIN diode cause the transimpedance amplifier to serve as a direct voltage amplifier and stabilize the direct current operation point of the transimpedance amplifier when the optical power arriving at the photo detector is above a given threshold.

11. An optical receiver comprising:

a transimpedance amplifier having an input and output, the output providing the output of the optical receiver;

a photo detector for converting optical power arriving at the receiver into electric current, an output of the photo detector being operationally connected to the input of the transimpedance amplifier; and a control loop consisting of the transimpedance amplifier, a PIN diode having a first terminal and a second terminal, the first terminal being operationally connected to the input of the transimpedance amplifier, and means for controlling current passing through the PIN diode by adjusting an impedance of the PIN diode, the means for controlling current being connected in series with the PIN diode between the input of the transimpedance amplifier and the output of the transimpedance amplifier, and the means for controlling current comprising means for separating a direct voltage component from an output voltage of the transimpedance amplifier, and means for controlling and adjusting a voltage over the PIN diode on a basis of a separated direct voltage component, wherein the means for controlling and adjusting comprises an amplifier having an input coupled to the direct voltage component, whereby properties of the PIN diode cause the transimpedance amplifier to serve as a direct voltage amplifier and stabilize the direct current operation point of the transimpedance amplifier when the optical power arriving at the photo detector is above a given threshold.

12. A method for controlling an optical receiver, the method comprising the steps of:

converting optical power arriving at the receiver into electric current by means of a photo detector, output of said photo detector being operationally connected to input of a transimpedance amplifier;

providing a control loop consisting of the transimpedance amplifier, a PIN diode, and means for controlling current passing through the PIN diode by adjusting an impedance of the PIN diode, the PIN diode and the means for controlling the current passing through the PIN diode being connected in series between the input and the output of the transimpedance amplifier;

controlling the electric current passing through the PIN diode by adjusting the impedance of the PIN diode, the PIN diode having a first terminal operationally connected to the input of the transimpedance amplifier;

separating a direct voltage component from a voltage on output of the transimpedance amplifier; and adjusting a voltage over the PIN diode on the basis of the direct voltage component separated in the separating step by means for controlling and adjusting voltage connected in series with the PIN diode between the input of the transimpedance amplifier and the output of the transimpedance amplifier, whereby properties of the PIN diode cause the transimpedance amplifier to serve as a direct voltage amplifier and stabilize the direct current operation point of the transimpedance amplifier when the optical power arriving at the photo detector is above a given threshold.

* * * * *